United States Patent [19]
Kim

[11] Patent Number: 5,491,109
[45] Date of Patent: Feb. 13, 1996

[54] METHOD FOR THE CONSTRUCTION OF HIGHLY INTEGRATED SEMICONDUCTOR CONNECTING DEVICE

[75] Inventor: Jae G. Kim, Bubaleub, Rep. of Korea

[73] Assignee: Hyundai Electronics Industries Co., Ltd., Kyoungkido, Rep. of Korea

[21] Appl. No.: 168,539

[22] Filed: Dec. 16, 1993

[30] Foreign Application Priority Data

Dec. 16, 1992 [KR] Rep. of Korea ............... 1992/24501

[51] Int. Cl.$^6$ ................................................ H01L 21/44
[52] U.S. Cl. ...................... 437/195; 437/231; 437/235
[58] Field of Search ................................ 437/195, 231, 437/235, 228, 195

[56] References Cited

U.S. PATENT DOCUMENTS 4,966,867 10/1990 Crotti et al. ........................ 437/235
5,063,176 11/1991 Lee et al. ........................... 437/195

*Primary Examiner*—Olik Chaudhuri
*Assistant Examiner*—C. Everhart
*Attorney, Agent, or Firm*—Merchant, Gould, Smith, Edell, Welter & Schmidt

[57] ABSTRACT

A method for the construction of a highly integrated semiconductor connecting device. In the semiconductor connecting device, a plurality of third conductive lines are connected with a plurality of first conductive lines formed in the active regions of a semiconductor substrate through contact holes formed on the active regions, passing by and being insulated with a plurality of second conductive lines which are intercalated between a first interlayer insulating film and a second interlayer film and which are formed above a plurality of device separation insulating films formed in the semiconductor substrate. With the method, a stepped part is avoided thereby eliminating a cause of a the short circuit caused by remnant conductive material. In addition, the charge storage electrodes are connected with the source electrodes, while being securely disconnected from the bit lines. Furthermore, the contact area in the inventive connecting device is remarkably diminished, as compared with that in the conventional ones. Consequently, a connecting device can be constructed with high integration degree and improved reliability.

12 Claims, 7 Drawing Sheets

5,491,109

METHOD FOR THE CONSTRUCTION OF HIGHLY INTEGRATED SEMICONDUCTOR CONNECTING DEVICE

BACKGROUND OF THE INVENTION

1. Field of the invention

The present invention relates, in general, to a method for constructing a highly integrated semiconductor connecting device, and more particularly to improvements in scaling the device down and in device reliability as a result of the method.

2. Description of the Prior Art

Generally, in fabricating a semiconductor device, a plurality of first conductive lines, a first interlayer insulating film, a plurality of second conductive lines and a second insulating film are formed, in due order, and then, a plurality of third conductive lines are formed over the second interlayer insulating film, the respective third conductive line passing between the second conductive lines and being connected with the first conductive line through respective third conductive line contact formed on the first conductive line. At this time, the third conductive line contact has to be spaced out from the second conductive line by a predetermined distance in order to insulate the third conductive line from the second conductive line.

Accordingly, in designing a connecting part in a highly integrated semiconductor device, the third conductive line contact mask and the second conductive line mask have to comply with a design rule.

That is, the second conductive line mask and the third conductive line contact mask to connect the third conductive line with the first conductive line have to be designed in such a way that the third conductive line contact is spaced out from the second conductive line by a predetermined distance. This restriction causes registration and critical dimension variation between the third conductive line and the second conductive line mask when the mask is made. In addition to this misalignment problem focus error of lens and critical dimension variation are generated when forming a pattern on a wafer. What is worse than any other problem is the increment of the connecting part in size because of the thickness of the insulating film formed between the third conductive line contact and the second conductive line.

For convenience, description for a method for connecting a charge storage electrode (the third conductive line) with a source electrode (the first conductive line) concurrently with insulating the charge storage electrode (the third conductive line) from a bit line (the first conductive line) in a DRAM cell structure, is to be given next.

Referring now to FIG. 1, there is a plan view showing generally only important mask layers necessary to form a self-aligned contact of connecting device in a DRAM cell structure, wherein reference letter A designates a plurality of spaced-apart source electrode masks while reference letters B, and $C_1$ and $C_2$ show respectively a plurality of spaced-apart bit line masks, and two types of charge storage electrode masks which can be alternatively employed in the present invention. As shown in FIG. 1, the charge storage electrode contact mask $C_2$ is to maximize the size of the charge storage electrode contact formed.

Prior art relating to the construction of highly integrated semiconductor connecting devices will be, in essence, explained with reference to several figures, wherein reference numeral 1 designates a semiconductor substrate, whereas other reference numerals 2, 3, 4, 5, 7, 8, 13', 18, 18' and 23 show a plurality of device separation insulating films, a plurality of source electrodes, a first interlayer insulating film, a plurality of bit lines, a photosensitive film (the charge storage electrode contact mask), a second interlayer insulating film, a plurality of charge storage electrodes, an insulating film for forming a spacer, an insulating film spacer and a remnant of conductive material for the charge storage electrode, respectively.

Referring initially to FIG. 3A, there is, in part, illustrated a construction method for a connecting device, taken generally through section line A—A' of FIG. 1. As illustrated in this figure, the conventional connecting device is constructed by sectioning firstly the semiconductor substrate 1 into active regions and device separation regions by means of the formation of the device separation insulating films 2 in the device separation regions.

The source electrodes 3 are formed in the active regions, followed by the formation of the first interlayer insulating film 4, a conductive material for the bit line and the second interlayer insulating film 8 over the resulting substrate, in due order.

Using the bit line mask of FIG. 1, an etch process is applied to the first interlayer insulating film 4, the conductive material for the bit lines and the second interlayer insulating film 8 to remove them atop the source electrodes 3. As a result, the bit lines 5 intercalated between the first interlayer film 4 and the second interlayer film 8 are formed, overlaying the device separation insulating films 2.

Following this, the insulating film 18 for creating a spacer is formed over the resulting structure including the exposed source electrodes 3 and the bit lines 5 intercalated between the first and, the second insulating films.

On the insulating film 18, a photosensitive film is coated, so as to form a charge storage electrode contact mask 7 (see FIG. 3A).

When the etch process is applied, the first interlayer insulating film 4 is etched in such a way that either the surface of the source electrode 3 is exposed thoroughly, or the first interlayer insulating film 4 is left thin.

Other insulating spacers may be formed at the side walls of the bit lines 5 in advance of the formation of the insulating film 18 which is to insulate the bit line 5 (the second conducive line as explained above) from the charge storage electrode (the third conductive line as explained above) to be formed later.

FIG. 3A shows that the charge storage electrode contact mask 7 can be is positioned in such a way as to cover a major part of the bit line 5 and to expose a minor part thereof. That is, the vertical axis passing the center of the charge storage electrode contact mask 7 can be spaced from the vertical axis passing the center of the bit line 5 by a the maximal distance depending on how the mask is made.

Referring now to FIG. 3B, there is illustrated the conventional construction method for a connecting device, continued from the FIG. 3A. As shown in this drawing, the charge storage electrodes 13' (the third conductive lines) are connected with the source electrodes 3 (the first conductive lines), being insulated from-the bit lines 5 (the second conductive lines).

For this, the insulating film 18 for creating a spacer is initially subjected to the treatment of etching by use of the charge storage electrode contact mask 7 to remove a predetermined thickness of the insulating film 18. As a result, the source electrodes 3 are exposed and the insulating films 3 and 18' for insulation are left over the bit lines; 5 and at the side walls thereof.

A conductive material for charge storage electrode is entirely deposited and then, subjected to the treatment of etching by use of the charge storage electrode mask so as to form the charge storage electrodes 13'.

With the above conventional method, the third conductive line is satisfactorily connected with the first conductive line, being securely insulated from the second conductive line.

However, when the connecting device is constructed by the conventional method described above, there is formed a steep stepped part which causes problems in a fabricated semiconductor device. For example, after applying the etch process to the conductive material for charge storage electrode deposited entirely in order to form the charge storage, a remnant material 23, as shown in FIG. 3B, remains at a steep stepped part formed by the first interlayer insulating film 4, the bit line 5 and the second interlayer insulating film 8. A short circuit may be formed between the remnant material and the neighboring charge storage electrode, degrading the fabricated semiconductor device.

Another conventional example is to be described again with reference to FIGS. 2A and 2B, taken generally through section line A—A' of FIG. 1.

Firstly, the semiconductor substrate 1 is sectioned into active regions and device separation regions by the formation of the device separation insulating films 2 in the device separation regions, as shown in FIG. 2A.

The source electrodes 3 are formed in the active regions, followed by the formation of the first interlayer insulating film 4 over the resulting structure including the source electrodes 3 and the device separation insulating films 2.

Over the first interlayer insulating film 4 are formed the bit lines 5 in a predetermined pattern which are subsequently covered with the second interlayer insulating film 8 for planarization.

Using the charge storage electrode contact mask, an etch process is applied to the second interlayer insulating film 8 and the first interlayer insulating film 4 to remove them atop the source electrode 3 and thus, to expose the source electrode 3.

Thereafter, the insulating film 18 for creating a spacer is entirely deposited over the resulting structure to insulate the bit lines 5.

FIG. 2A shows that the second insulating film 8 is formed in such a way to expose the partial upper surface and the one side wall of the bit line 5 and to cover others portions thereof. This is based on the fact that the vertical axis passing the center of the charge storage electrode contact mask positioned on the second insulating film can be spaced from the vertical axis passing the center of the bit line 5 by a maximal distance depending on how the mask is made.

The exposure of the bit lines 5 causes a problem with regard to the thickness of the spacer insulating film 18. For example, if the spacer insulating film is too thick, the area of contact can be so small that the charge storage electrode is difficult to connect with the source electrode. On the other hand, if the spacer insulating film is too thin, the side wall of the, spacer insulating film is aligned with the side wall of the exposed bit line 5, such that the bit lines 5 cannot be insulated sufficiently.

Turning now to FIG. 2B, there is illustrated an etch back which is applied to the insulating film 18 so as to form insulating spacers 18' at the exposed side walls of the bit lines 5.

The another conventional method can reduce the steepness of the stepped part, as shown in FIG. 2B.

However, as mentioned above, the another conventional method has difficulty in controlling the thickness of the insulating film for creating a spacer. That is, thick insulating film prevents the connection of the third conductive line with the first conductive line whereas thin insulating film results in incomplete insulation of the third conductive line from the second conductive line.

What is worse, since the second interlayer insulating film 8 covers partially the bit lines 5, the spacer formed from the insulating film 18 cannot insulate the upper surface of the bit line sufficiently in spite of sufficient insulating the side wall of the bit line.

Accordingly, the another conventional method is apt to generate a short circuit between the charge storage electrode and the bit line, degrading the semiconductor device manufactured thereby.

In addition, a little reduction of the distance between the charge storage electrode contact mask and the bit line affects the contact area, resulting in the disconnection of the charge storage electrode with the source electrode.

As a result, the connecting device cannot be sufficiently scaled down by the conventional method because the area of connecting part is restricted.

SUMMARY OF THE INVENTION

Therefore, the present inventors have recognized that there exists a need for a method for constructing a highly integrated semiconductor connecting device, capable improving the device reliability and integration degree.

It is an object of the present invention to provide a method for making a highly integrated connecting device, which prevents the formation of a steep, stepped part.

It is another object of the present invention to provide a method for making a highly integrated connecting device, capable of minimizing the contact area.

It is further an object of the present invention to provide a method for making a highly integrated connecting device, capable of securing the connection through the contact and the insulation.

In accordance with an embodiment of the present invention, the above objects can be accomplished by providing a method for constructing a highly integrated semiconductor connecting device, comprising the steps of: forming a sacrificial insulating film over an entire structure comprising a plurality of parallel, spaced-apart second conductive lines formed on-a first interlayer insulating film overlaying a semiconductor substrate sectioned into active regions having a plurality of first conductive lines and device separation regions having a plurality of device separation insulating film, the plurality of parallel, spaced-apart second conductive lines resulting from the etch of a conductive material deposited on the first interlayer insulating film; etching the sacrificial insulating film and the first interlayer insulating film atop the first conductive lines by use of a mask in such a range that a plurality of the first conductive lines are not damaged; forming a second interlayer insulating film entirely to insulate a plurality of the parallel, spaced-apart second conductive lines which are exposed by the etch; depositing a silicon film, a diffusing barrier nitride film and an etching barrier spin-on-source film, in due order; applying an etch back to the spin-on-source film so as to leave the spin-on-source film on only the nitride film formed between the second conductive lines, the nitride film being exposed at other portions; subjecting the exposed portions of the nitride film to the treatment of etching so as to leave the nitride film on only the silicon film formed between the second conductive lines, by use of the left spin-on-source film as an etching barrier material; removing the spin-on-source film; growing a thermal oxide film on exposed portions of the silicon film; eliminating the left, diffusing barrier nitride film from the silicon film to partially expose the silicon film; etching the exposed part of the silicon film by use of the thermal oxide film as an etch barrier material so as to expose the second interlayer insulating film atop the first interlayer insulating film; applying an etch to the exposed second interlayer insulating film and the first interlayer insulating film by use of the resulting silicon film as an etching barrier material so as to form contact holes on the first conductive lines; depositing a conductive material entirely to form electrode contacts on the first conductive lines, respectively, the electrode contacts passing by the second conductive lines; and etching the conductive material in a predetermined pattern to form third conductive lines which are connected with the first conductive lines and insulated from the second conductive lines.

In accordance with another embodiment of the present invention, the above objects can be accomplished by providing a method for constructing a highly integrated semiconductor connecting device, comprising the steps of: forming a sacrificial insulating film over an entire structure comprising a plurality of parallel, spaced-apart bit lines formed on a first interlayer insulating film overlaying a semiconductor substrate sectioned into active regions having a plurality of source electrodes and device separation regions having device separation insulating films, the plurality of parallel, spaced-apart bit lines resulting from the etch of a conductive material deposited on the first interlayer insulating film; etching the sacrificial insulating film and the first interlayer insulating film atop the plurality of source electrodes by use of a mask in such a range that the plurality of source electrodes are not damaged; forming a second interlayer insulating film entirely over the resulting structure to insulate a plurality of the parallel, spaced-apart bit lines which are exposed by the etch; depositing a silicon film, a diffusing barrier nitride film and an etching barrier spin-on-source film, in due order; applying an etch back to the spin-on-source film so as to leave the spin-on-source film on only the nitride film formed-between the bit lines, the nitride film being exposed at other portions; subjecting the exposed portions of the nitride film to the treatment of etching so as to leave the nitride film on only the silicon film formed between the bit lines, by use of the left spin-on-source film as an etching barrier material; removing the spin-on-source film; growing a thermal oxide film on exposed portions of the silicon film; eliminating the left, diffusing barrier nitride film from the silicon film to partially expose the silicon film; etching the exposed part of the silicon film by use of the thermal oxide film as an etch barrier material so as to expose the second interlayer insulating film stop the first interlayer insulating film; applying an etch to the exposed second interlayer insulating film and the first interlayer insulating film by use of the resulting silicon film as an etching barrier material so as to form contact holes on the source electrodes; depositing a conductive material entirely to form electrode contacts on the source electrodes, respectively, the electrode contacts passing by the bit lines; and etching the conductive material in a predetermined pattern to form charge storage electrodes which are connected with the source electrodes and insulated from the bit lines.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
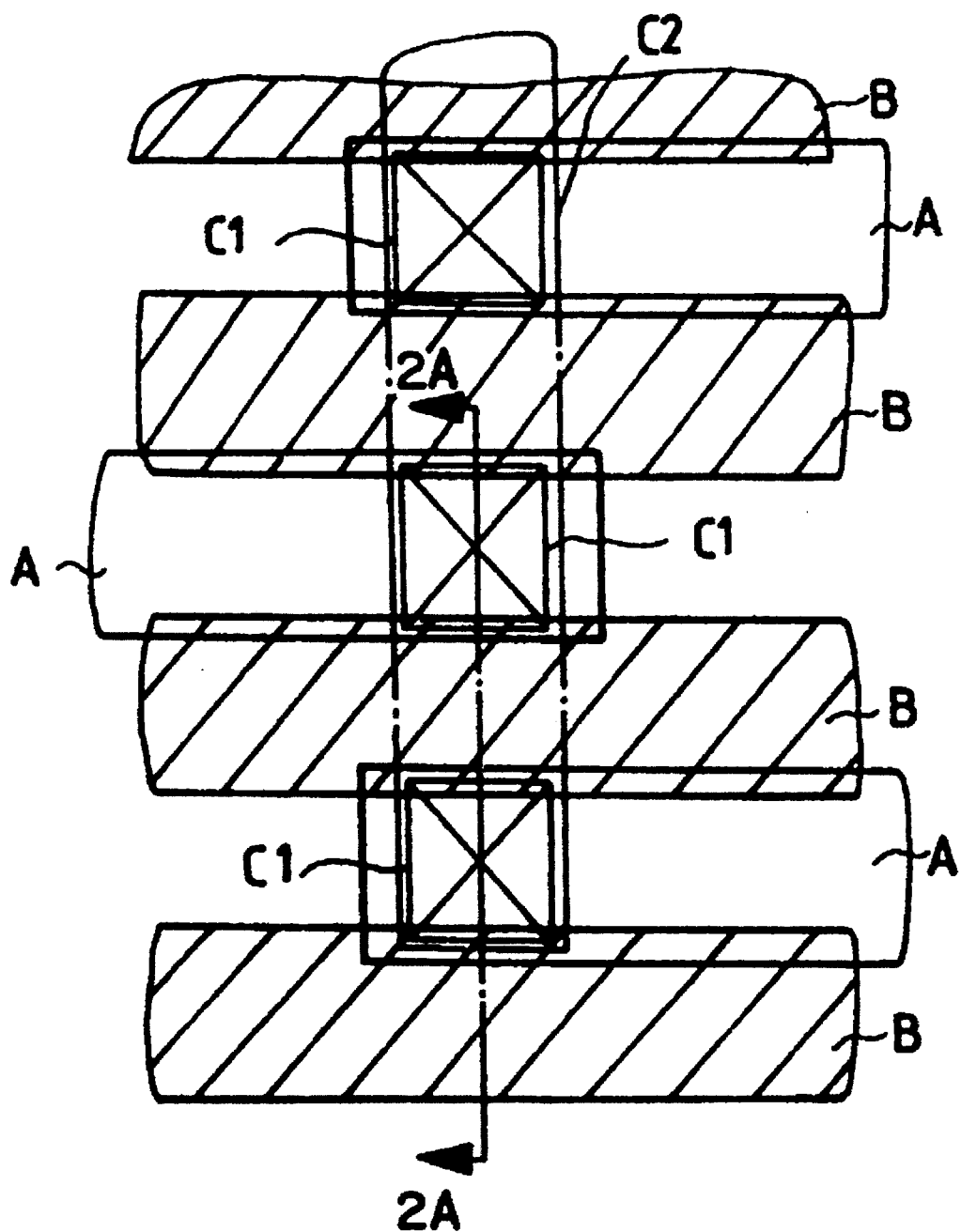
FIG. 1 is a schematic, plan view showing generally only important mask layers necessary to form a self-aligned contact for a connecting device in a DRAM cell structure.
Figure 2A:
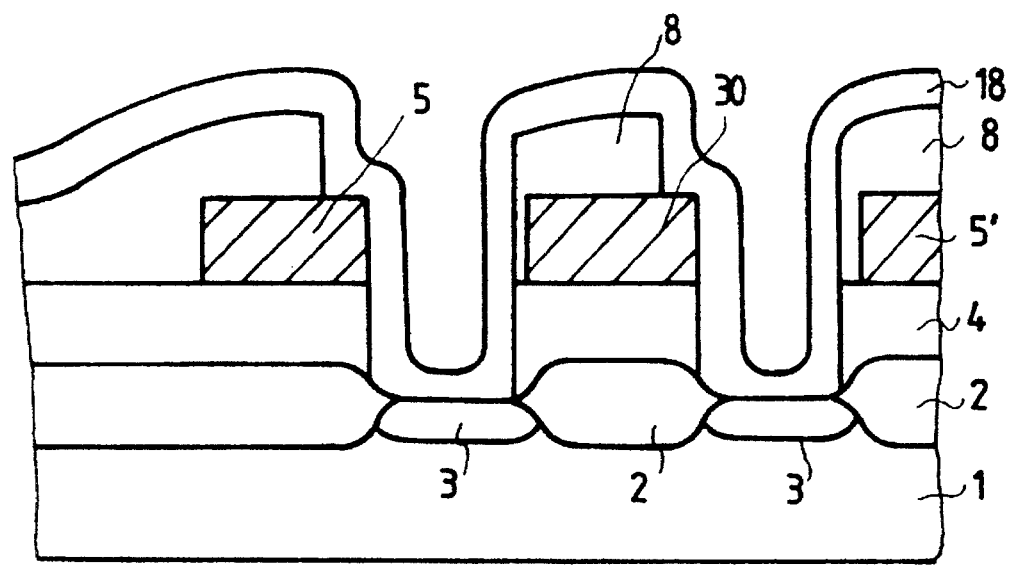
FIGS. 2A and 2B are schematic, cross-sectional views illustrating one conventional method for forming a self-aligned contact for a connecting device.
Figure 2B:
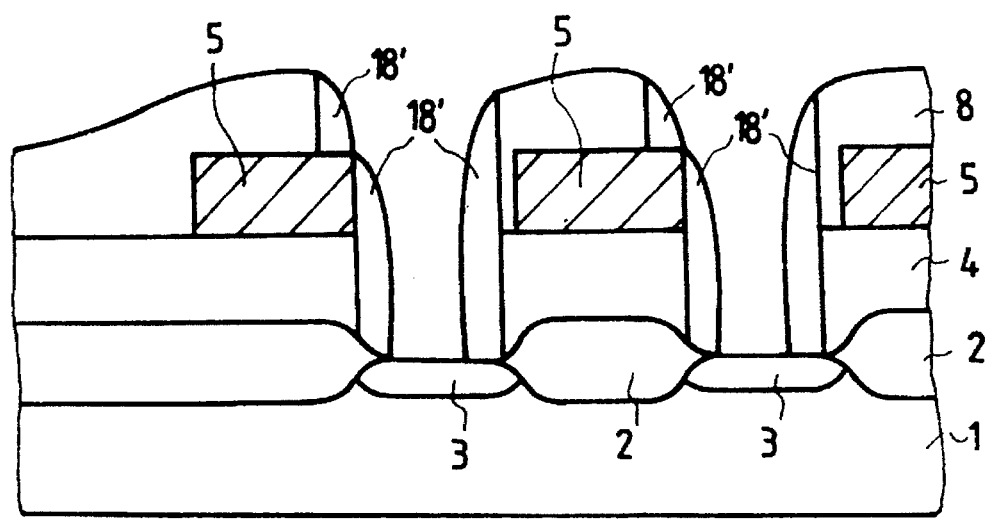
Figure 3A:
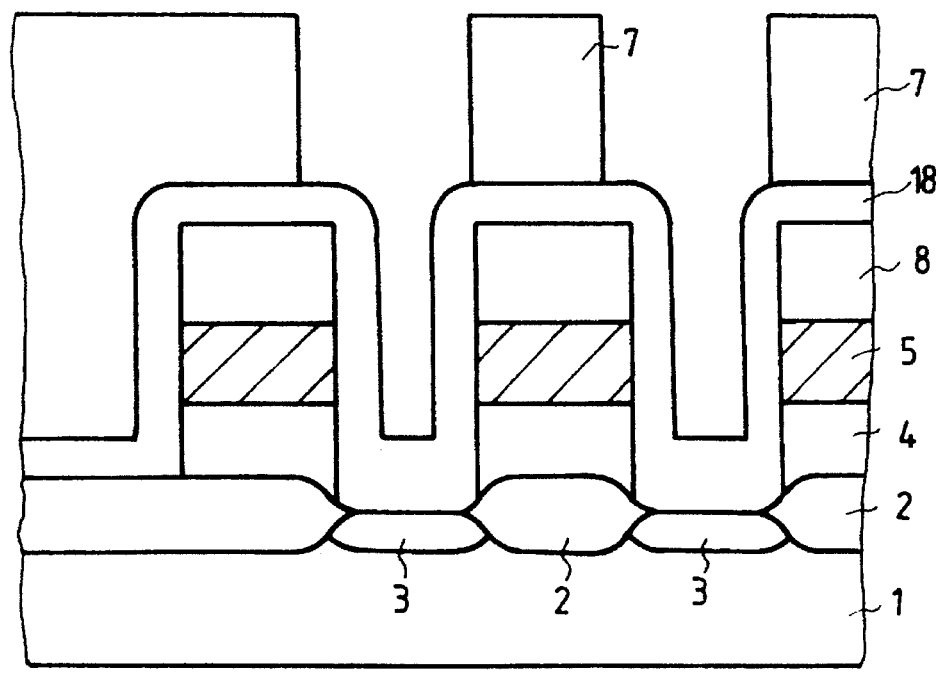
FIGS. 3A and 3B are schematic, cross-sectional views illustrating another conventional method for forming a self-aligned contact for connecting device.
Figure 3B:
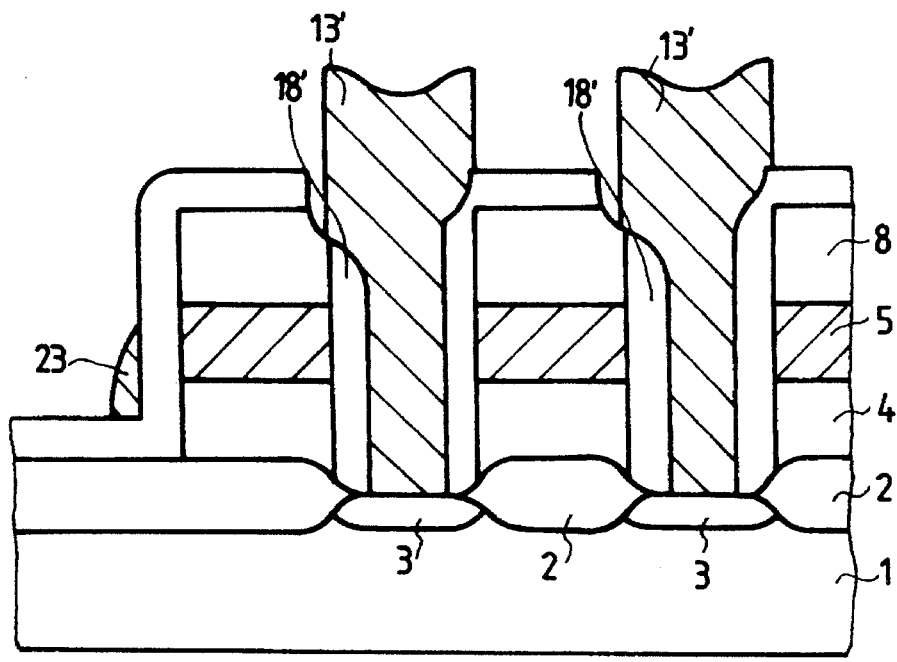

Hereinafter, the preferred embodiments of the present invention will be in detail described with reference to some figures, wherein like reference numerals designate like parts, respectively. This description is illustrative of a DRAM cell, for convenience.

Referring initially to FIGS. 4A to 4E there is illustrated a method for constructing a connecting device according to the present invention.

Figure 4A:
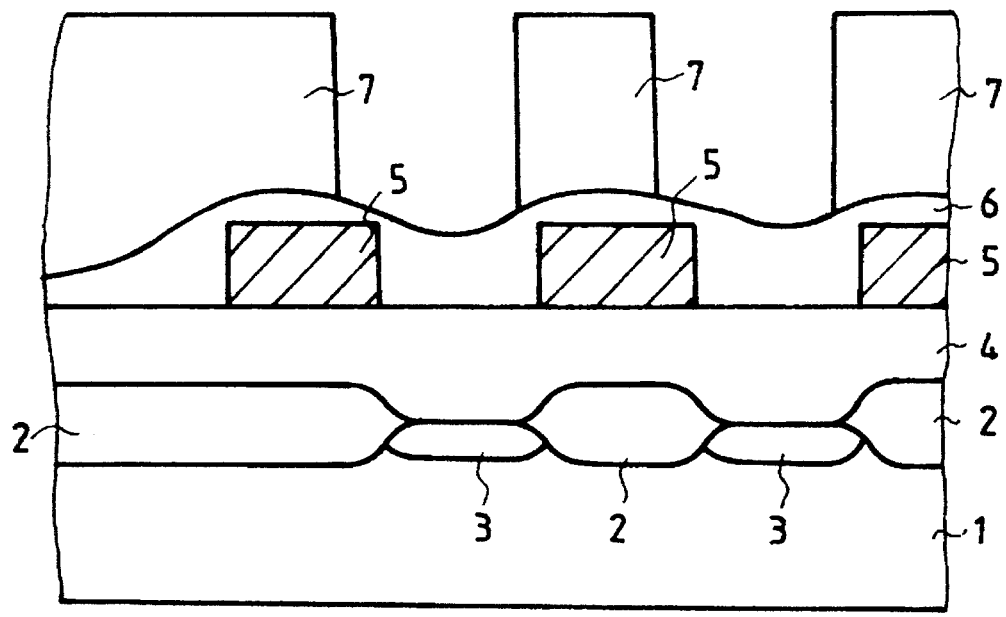
FIGS. 4A through 4E are schematic, cross-sectional views illustrating a method for constructing a highly integrated semiconductor connecting device.

As shown in FIG. 4A, the connecting device according to the present invention is, in part, constructed by firstly sectioning a semiconductor substrate 1 into active regions and device separation regions through the formation of device separation insulating films 2 in the device separation regions and then, by forming source electrodes 3 in the active regions, respectively.

Over the resulting structure, there is entirely formed a first interlayer insulating film 4 on which a plurality of spaced-apart bit lines 5 are subsequently formed above the device separation insulating films 2.

Thereafter, a sacrificial insulating film 6 is entirely formed, followed by the formation of a plurality of spaced-apart charge storage electrode contact masks 7, as shown in FIG. 4A.

The sacrificial insulating film 6 is used to easily etch a conductive material for charge storage electrode. Preferred materials used as the sacrificial insulating film 6 include boro-phospho-silicate glass (hereinafter "BPSG"), dual structure of undoped silicate glass (hereinafter "USG")/BPSG, spin-on-glass (hereinafter "SOG") and polyimide.

The charge storage electrode contact masks 7 of FIG. 4A which are formed by use of the charge storage electrode contact masks $C_1$ of FIG. 1 are positioned in such a way as to cover a major part of the bit lines 5 and to expose a minor part thereof. The vertical axis passing through the center of the charge storage electrode contact mask 7 is spaced from the vertical axis passing through the center of the bit line 5 by the maximal distance which may be generated depending on how the masks are made.

Figure 4B:
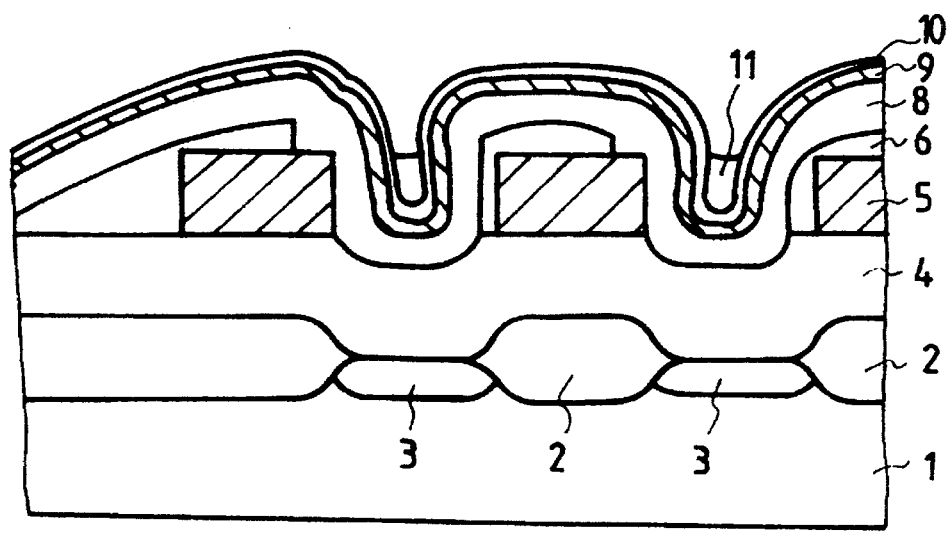

As shown in FIG. 4B, the sacrificial insulating film 6 is etched to a predetermined thickness by use of a plurality of spaced-apart charge storage electrode contact masks 7 so as to form grooves between the bit lines 5. As a result of the etching, the one side of the bit line 5 is covered with the sacrificial insulating film whereas the other side thereof is exposed.

A second interlayer insulating film 8 is entirely formed over the resulting structure, followed by the formation of a silicon film 9 and a nitride film 10 over the second interlayer insulating film 8, in due order. While the silicon film 9 plays a role of etching barrier material, the nitride film 10 restricts the diffusion of oxide on growing a thermal oxide film.

Thereafter, the nitride film 10 is coated with an etching barrier spin-in-source (hereinafter "SOS" ) film 11 which is then, subjected to etch back in such a way to leave the SOS film 11 within the corrugations of the nitride film 10 formed as a result of the grooves.

Preferred materials used as the SOS film 11 include a photosensitive film, SOG and polyimide.

By the way, the interlayer insulating film 8 may be subjected to an etch back to form spacer insulating films in advance of the formation of the silicon film 9, as described in the above conventional method.

Using the SOS film 11 formed within the corrugations of the nitride film 10 as etching barrier materials, the exposed, diffusing barrier nitride film 10 is etched. The SOS film 11 is then removed. As a result, the polysilicon film is covered at the corrugations with the diffusing barrier nitride films 10 which are left within the corrugations of the silicon film 9 formed as a result of the grooves between the bit lines 5 whereas it is exposed at the exterior of the corrugations.

Figure 4C:
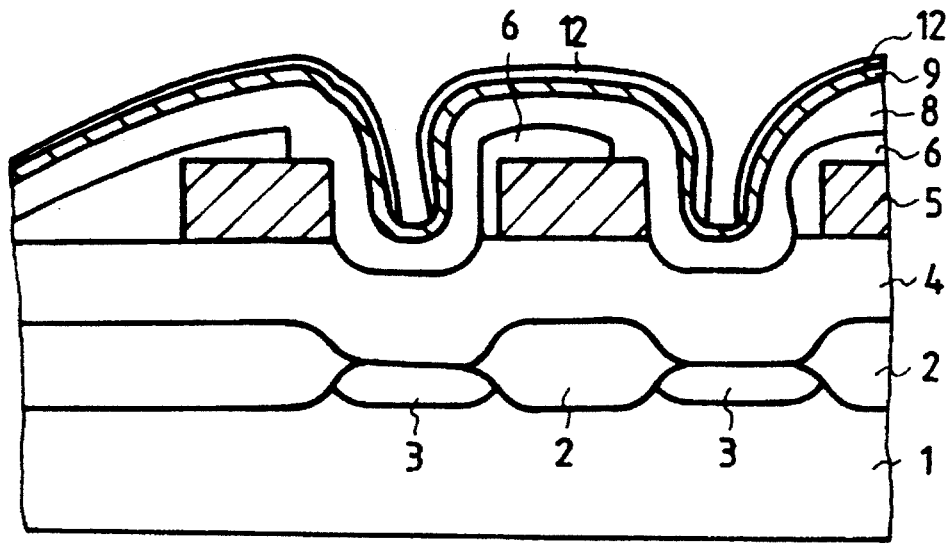

A thermal oxide film 12 is grown to a predetermined thickness on the surface of the exposed silicon film 9 when the diffusing barrier nitride film 10 within the corrugations of the silicon film 9 is removed, as shown in FIG. 4C.

Using the thermal oxide film 12 on the upper portions of the corrugations above the source electrode and on the exteriors as an etching barrier material, the exposed silicon film 9 is etched at the lower portions of the corrugations so as to expose the second interlayer insulating film 8 overlaying the first interlayer insulating film 4 atop the source electrode 3.

The resulting silicon film 9 is utilized as an etching barrier material while another etch process is applied to the exposed second interlayer insulating film 8 and the first interlayer insulating film 4 atop the source electrode 3 to form a contact hole exposing the source electrode 3 therethrough.

Figure 4D:
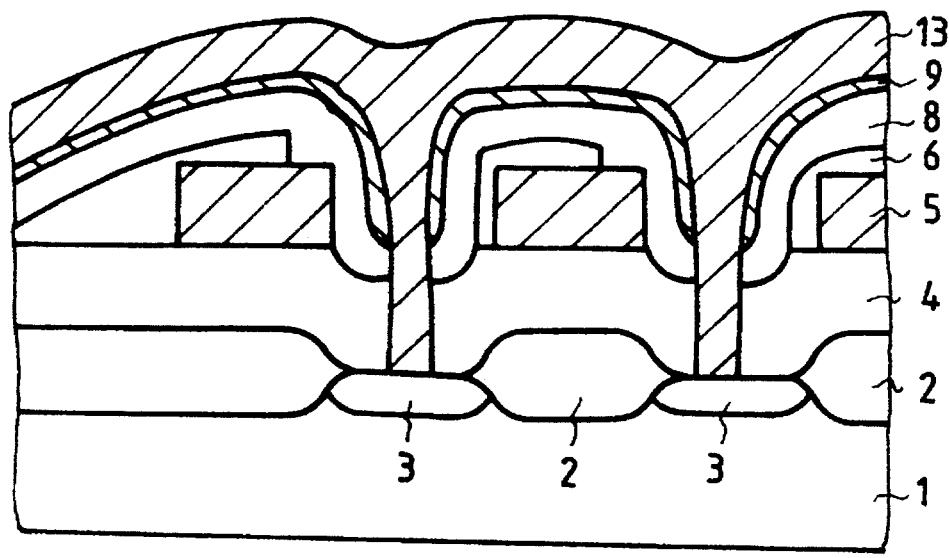

Over the resulting structure, a conductive material 13 for charge storage electrode is entirely deposited, as shown in FIG. 4D.

Figure 4E:
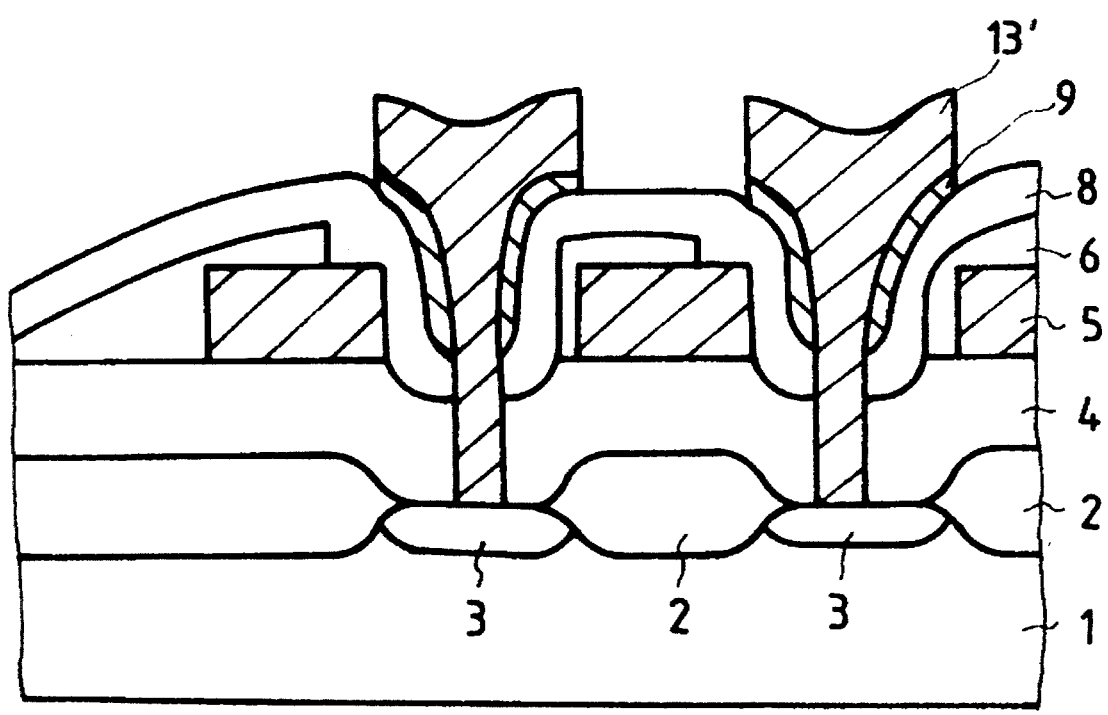

The conductive material 13 for charge storage electrode is then subjected to the treatment of etching to form charge storage electrodes 13' which are connected with the source electrodes 3, respectively, using a charge storage electrode mask, as shown in FIG. 4E.

Figure 5:
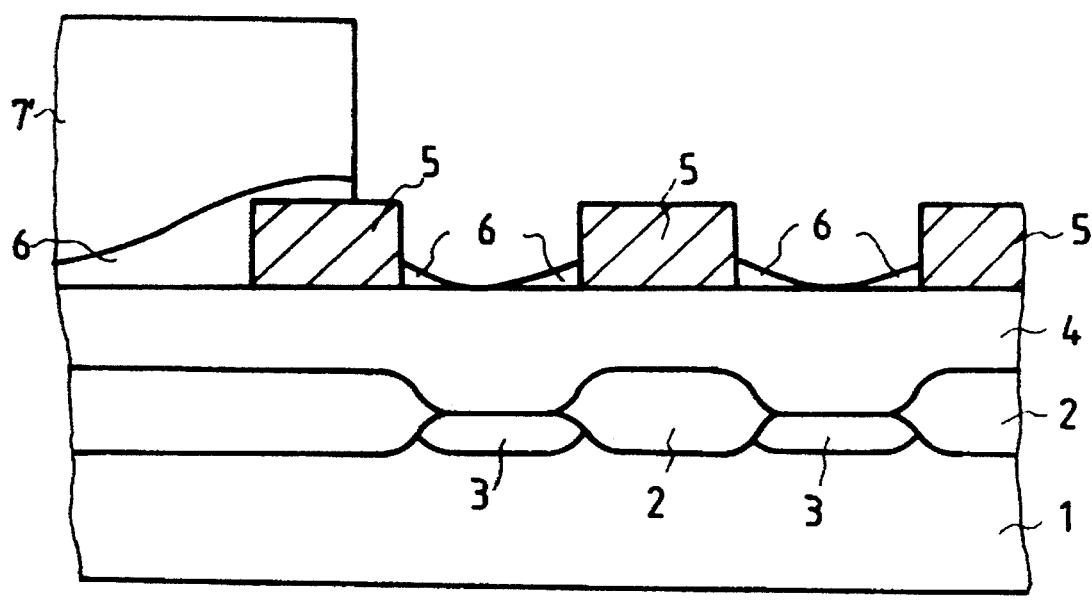
FIG. 5 is a schematic, cross-sectional view showing another embodiment of the present invention.

Turning now FIG. 5, there is shown another preferred embodiment of the present invention. As shown in this drawing, one charge storage electrode contact is formed instead of a plurality of charge storage electrode contacts of FIG. 4. This charge storage electrode contact which is perpendicular to the bit lines 5 is formed using the charge storage electrode contact mask $C_2$ of FIG. 1. The sacrificial insulating film 6 is subjected to etch back so as to maximize the size of the charge storage electrode contact formed between the bit lines 5.

As mentioned above, the sacrificial insulating film 6 serves to easily etch the conductive material 13 for charge storage electrode by subjecting the surface of the second interlayer insulating film 8 into planarization, so that a remnant of conductive material 13 for charge storage electrode is not formed when the conductive material 13 is subjected to etching in the inventive semiconductor connecting device.

The third conductive lines (the charge storage electrodes 13') are securely connected with the first conductive lines (the source electrodes 3), satisfying the condition of insulation from the second conductive lines (the bit lines 5), in accordance with the method of the present invention.

As illuminated hereinbefore, there is not formed steep, stepped part in the inventive connecting device, thereby preventing a short circuit caused by remnant conductive material.

In addition, the charge storage electrodes are connected with the source electrodes, being securely disconnected with the bit lines, in accordance with the method of the present invention.

Furthermore, the contact area in the inventive connecting device is remarkably diminished, as compared with that in the conventional ones.

Consequently, a connecting device can be constructed with high integration degree and improved reliability in accordance with the method of the present invention.

Whilst the present invention has been described with reference to certain preferred embodiments and examples of DRAM cell, it will be appreciated by those skilled in the art that numerous variations and modifications are possible without departing from the spirit or scope of the invention as broadly described. Therefore, the present invention is applicable to any semiconductor connecting device.

What is claimed is:

1. A method for constructing a highly integrated connecting device, comprising the steps of:

forming a sacrificial insulating film over a structure comprising a plurality of spaced-apart second conductive lines formed on a first interlayer insulating film overlaying a semiconductor substrate sectioned into active regions having a plurality of first conductive lines and device separation regions, said plurality of spaced-apart second conductive lines resulting from the etch of a conductive material deposited on said first interlayer insulating film;

etching said sacrificial insulating film and said first interlayer insulating film atop said first conductive lines by use of a mask in such a range that a plurality of said first conductive lines are not damaged;

forming a second interlayer insulating film to insulate said spaced-apart second conductive lines which are exposed by said etch;

depositing a silicon film, a diffusing barrier nitride film and an etching barrier spin-on-source film, in due order;

applying an etch back to said spin-on-source film so that said spin-on-source film remains on only said nitride film formed between said second conductive lines, said nitride film being exposed at other portions;

subjecting said exposed portions of said nitride film to the treatment of etching so that said nitride film remains on only said silicon film formed between said second conductive lines, by use of said remaining spin-on-source film as an etching barrier material;

removing said spin-on-source film;

growing a thermal oxide film on exposed portions of said silicon film;

eliminating said remaining diffusing barrier nitride film from said silicon film to partially expose said silicon film;

etching the exposed part of said silicon film by use of said thermal oxide film as an etch barrier material so as to expose said second interlayer insulating film atop said first interlayer insulating film;

applying an etch to said exposed second interlayer insulating film and said first interlayer insulating film by use of said resulting silicon film as an etching barrier material so as to form contact holes on said first conductive lines;

depositing a conductive material to form electrode contacts on said first conductive lines, respectively, said electrode contacts passing by said second conductive lines; and etching said conductive material in a pattern to form third conductive lines which are connected with said first conductive lines and insulated from said second conductive lines.

2. A method according to claim 1, wherein the step of etching said sacrificial insulating film and said first interlayer insulating film atop said first conductive lines is performed by use of a contact mask having a plurality of contact hole-forming portions in order that a plurality of said third conductive lines come into contact with a plurality of said first conductive lines, respectively, through said respective contact holes formed.

3. A method according to claim 1, wherein said step of etching said sacrificial insulating film and said first interlayer insulating film to etch back with a contact mask to form a plurality of contacts perpendicular to the direction of said second conductive lines.

4. A method according to claim 1, further comprising the steps of:

applying an anisotropic etching to said second interlayer insulating film to form spacer insulating films at the side walls provided by said etched sacrificial films and said second conductive lines, said spacer insulating films serving to reduce the steepness of stepped part, after said step of forming said second interlayer insulating film to insulate a plurality of said spaced-apart second conductive lines.

5. A method according to claim 1, wherein said sacrificial insulating film is selected from a group consisting of boro-phospho-silicate glass, dual structure of undoped silicate grass/boro-phospho-silicate glass, spin-on-glass and polyimide.

6. A method according to claim 1, wherein said spin-on-source film is selected from a group consisting of a photosensitive film, spin-on-glass and polyimide.

7. A method for constructing a highly integrated semiconductor connection device, comprising the steps of:

forming a sacrificial insulating film over a structure comprising a plurality of spaced-apart bit lines formed on a first interlayer insulating film overlaying a semiconductor substrate sectioned into active regions having a plurality of source electrodes and device separation regions having device separation insulating films, said spaced-apart bit lines resulting from the etch of a conductive material deposited on said first interlayer insulating film;

etching said sacrificial insulating film and said first interlayer insulating film atop said plurality of source electrodes by use of a mask in such a range that said source electrodes are not damaged;

forming a second interlayer insulating film over the resulting structure to insulate said spaced-apart bit lines which are exposed by said etch;

depositing a silicon film, a diffusing barrier nitride film and an etching barrier spin-on-source film, in due order;

applying an etch back to said spin-on-source film so that said spin-on-source film remains on only said nitride film formed between said bit lines, said nitride film being exposed at other portions;

subjecting said exposed portions of said nitride film to a treatment of etching so that said nitride film remains on only said silicon film formed between said bit lines, by using said remaining spin-on-source film as an etching barrier material;

removing said spin-on-source film;

growing a thermal oxide film on exposed portions of said silicon film;

eliminating said remaining nitride film from said silicon film to partially expose said silicon film;

etching the exposed part of said silicon film by use of said thermal oxide film as an etch barrier material so as to expose said second interlayer insulating film atop said first interlayer insulating film;

applying an etch to said exposed second interlayer insulating film and said first interlayer insulating film by use of said resulting silicon film as an etching barrier material so as to form contact holes on said source electrodes;

depositing a conductive material to form electrode contacts on said source electrodes, respectively, said electrode contacts passing by said bit lines; and etching said conductive material in a pattern to form charge storage electrodes which are connected with said source electrodes and insulated from said bit lines.

8. A method according to claim 7, wherein the step of etching said sacrificial insulating film and said first interlayer insulating film atop said source electrodes is carried out by use of a contact mask having a plurality of contact hole-forming portions in order that said electrode contacts come into contact with said source electrodes, respectively, through said respective contact holes formed.

9. A method according to claim 7, wherein said step of etching said sacrificial insulating film and said first interlayer insulating film atop said source electrodes is carried out by subjecting said sacrificial insulating film to an etch back with a contact mask to form a plurality of contacts perpendicular to the direction of said bit lines.

10. A method according to claim 1, further comprising the steps of:

applying an anisotropic etching to said second interlayer insulating film to form spacer insulating films at the side walls provided by said etched sacrificial films and said bit lines, said spacer insulating films serving to reduce the steepness of stepped part, after said step of forming said second interlayer insulating film to insulate said spaced-apart bit lines.

11. A method according to claim 1, wherein said sacrificial insulating film is selected from a group consisting of boro-phospho-silicate glass, dual structure of undoped silicate glass/boro-phospho-silicate glass, spin-on-glass and polyimide.

12. A method according to claim 1, wherein said spin-on-source film is selected from a group consisting of a photosensitive film, spin-on-glass and polyimide.

* * * * *

UNITED STATES PATENT AND TRADEMARK OFFICE
CERTIFICATE OF CORRECTION

PATENT NO. : 5,491,109

DATED : February 13, 1996

INVENTOR(S) : Jae K. Kim

It is certified that error appears in the above-identified patent and that said Letters Patent is hereby corrected as shown below:

```
Column (75), Inventor, replace "G." with --K.--
Abstract, line 12, delete "the" after "a"
Column 2, line 13, replace "A-A'" with --2A-2A --
Column 2, line 50, delete "is" after "be"
Column 3, line 25, replace "A-A'" with --2A-2A --
Column 4, line 32, insert --of-- after "capable"
Column 4, line 51, replace "on-a" with --on a --
Column 7, line 65, insert --to-- after "now"
Column 8, line 21, insert --a-- after "formed"
Column 9, line 42, insert --is performed by subjecting said
sacrificial insulating film-- after "film"
```

Signed and Sealed this

Thirteenth Day of August, 1996

BRUCE LEHMAN

*Attest:*

*Attesting Officer*  *Commissioner of Patents and Trademarks*